United States Patent
Neidorff et al.

(10) Patent No.: US 11,296,016 B2
(45) Date of Patent: Apr. 5, 2022

(54) SEMICONDUCTOR DEVICES AND METHODS AND APPARATUS TO PRODUCE SUCH SEMICONDUCTOR DEVICES

(71) Applicant: Texas Instruments Incorporated, Dallas, TX (US)

(72) Inventors: Robert Allan Neidorff, Bedford, NH (US); Benjamin Cook, Addison, TX (US); Steven Alfred Kummerl, Carrollton, TX (US); Barry Jon Male, West Granby, CT (US); Peter Smeys, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 174 days.

(21) Appl. No.: 15/808,537

(22) Filed: Nov. 9, 2017

(65) Prior Publication Data
US 2019/0139868 A1 May 9, 2019

(51) Int. Cl.
| | |
|---|---|
| *H01L 23/495* | (2006.01) |
| *H01L 23/485* | (2006.01) |
| *H01L 23/31* | (2006.01) |
| *B81C 1/00* | (2006.01) |

(52) U.S. Cl.
CPC .... *H01L 23/49534* (2013.01); *B81C 1/00333* (2013.01); *H01L 23/3107* (2013.01); *H01L 23/485* (2013.01); *H01L 23/49579* (2013.01); *B81C 2201/013* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2224/83385* (2013.01); *H01L 2924/1461* (2013.01); *H01L 2924/181* (2013.01)

(58) Field of Classification Search
CPC ............ H01L 23/49534; H01L 23/485; H01L 23/49579; H01L 23/3107; H01L 2224/32245; H01L 2224/48091; H01L 2224/48247; H01L 2224/48465; H01L 2224/73265; H01L 2224/83385; H01L 2924/1461; H01L 2924/181; B81C 2201/013; B81C 1/00333
See application file for complete search history.

(56) References Cited

U.S. PATENT DOCUMENTS

| | | | |
|---|---|---|---|
| 9,419,075 B1 | 8/2016 | Carothers et al. | |
| 9,865,537 B1 * | 1/2018 | Male .................... | H01L 23/315 |

(Continued)

OTHER PUBLICATIONS

Unpublished U.S. Appl. No. 15/248,151, filed Aug. 26, 2017, 36 pages.

*Primary Examiner* — Robert G Bachner
(74) *Attorney, Agent, or Firm* — Dawn Jos; Charles A. Brill; Frank D. Cimino (57) ABSTRACT

Semiconductor devices and methods and apparatus to produce such semiconductor devices are disclosed. An integrated circuit package includes a lead frame including a die attach pad and a plurality of leads; a die including a MEMs region defined by a plurality of trenches, the die electrically connected to the plurality of leads; and a mold compound covering portions of the die, the mold compound defining a cavity between a surface of the die and a surface of the mold compound, wherein the mold compound defines a vent.

18 Claims, 8 Drawing Sheets

(56) References Cited

U.S. PATENT DOCUMENTS

| | | | |
|---|---|---|---|
| 2010/0197063 A1* | 8/2010 | Bluzer | H01L 31/18 438/51 |
| 2010/0290199 A1* | 11/2010 | Schmid | B81C 1/00301 361/752 |
| 2013/0119490 A1* | 5/2013 | Harame | H01L 41/094 257/416 |
| 2015/0249891 A1* | 9/2015 | Kim | H04R 1/06 381/369 |
| 2016/0075554 A1* | 3/2016 | Huang | B81B 7/02 257/417 |
| 2016/0169758 A1* | 6/2016 | Hooper | B81B 7/0061 73/717 |
| 2017/0219620 A1* | 8/2017 | Jeong | B81B 3/00 |

* cited by examiner

SEMICONDUCTOR DEVICES AND METHODS AND APPARATUS TO PRODUCE SUCH SEMICONDUCTOR DEVICES

FIELD OF THE DISCLOSURE

This disclosure relates generally to semiconductor devices, and, more particularly, to semiconductor devices and methods and apparatus to produce such semiconductor devices.

BACKGROUND

Some semiconductor devices include microelectromechanical systems (MEMs). Depending on the semiconductor device and/or the intended application, the MEMs may have structures that are relatively fragile.

SUMMARY

An example integrated circuit package includes a lead frame including a die attach pad and a plurality of leads; a die including a MEMs region defined by a plurality of trenches, the die electrically connected to the plurality of leads; and a mold compound covering portions of the die, the mold compound defining a cavity between a surface of the die and a surface of the mold compound, the mold compound defining a vent.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

The examples disclosed herein relate to manufacturing processes that protect components and/or structures (e.g., microelectromechanical systems (MEMs)) of integrated circuits during such manufacturing processes. Some example processes include activities such as wafer handling, wafer sawing, die pick-and-place, die attach, ultrasonic wire bonding activities and/or package molding activities. While other examples exist, some MEMs include micro-sensors, microelectronics, micro-actuators and/or micro-structures. For example, some MEMs are implemented in inertial sensors; surgical tweezers; accelerometers; gyroscopes; micro machines; micro, low loss mechanical relays; micro-mirrors/reflectors; cantilever devices; surface resonator arrays; micro-fluidic elements; precision stress and temperature isolation MEMs; and/or biological manipulators. Some example micro machines include motors, solenoids, moving links and/or actuators. Some example cantilever devices include resonators, force sensors, atomic force probes, etc. Of course, the example structures protected using the teachings of this disclosure may include any current technology and any future technology not yet in existence.

To protect example structures (e.g., components, fragile portions) during manufacturing processes or otherwise, in some examples, an example layer (e.g., a molding material) is deposited (selectively deposited) on the structures to form a protective coating on the structures of the MEMs, the wafer and/or the circuit being formed. Some of these example structures are free standing and/or partially restricted structures of MEMs devices. In some examples, inkjet processes, three-dimensional (3D) printing processes and/or screen printing processes are used to apply and/or add the layer to the wafer, the integrated circuit and/or select areas thereof including one or more MEMs devices. However, in other examples, any other process is used to apply the layer. For example, spin coat lithography may be used to apply and/or deposit the protective material and/or layer.

In some examples, the layer holds the structures in place and/or deters the structures from being damaged. The material included in the layer can be solid at room temperature and have an ability to sublime when heated to enable the layer to be removed if desired. As set forth herein, the term "sublime" means a material that changes directly from a solid to a gas or a vapor. Some example materials that can be included in the layer include a Neopentyl glycol layer, a Trimethylolethane layer, a 2 5-dimethyl-2 5-hexanediol layer or any other material that has characteristics to implement the teachings of this disclosure. To deter the mold compound from vaporizing and/or being removed from the corresponding structure unless such removal is intended, the mold compound can be configured to vaporize at a temperature that is higher than temperatures to which the semiconductor device is exposed during processes prior to the sublimation process(es).

In some examples, the layer is removed after a mold compound is added during one or more package injection molding processes that secure and/or protect the MEMs device. In other words, the structures (e.g., the MEMs devices) may remain protected by the layer during manufacturing operations, handling operations, etc. (e.g., all integrated circuit manufacturing processes), thereby enabling less expensive molding materials to be used and for higher production counts/yields to be achievable. Some of these manufacturing operations and/or handling operations may include sawing, handling and/or packaging, etc.

In some examples, by protecting the structures during the manufacturing process, lower cost molding materials can be used that would not otherwise be usable but for the examples disclosed herein. If such lower cost molding materials were used without implementing the teachings of this disclosure, such lower cost molding materials would enable the structures to be damaged during manufacturing operations, handling operations, etc. Some lower cost molding materials include plastic. However, any lower cost material or any higher cost material (e.g., ceramic) can be used when implementing the teachings of this disclosure.

To remove the layer (e.g., the sublimation layer, the protective layer, the mold compound), in some examples, the semiconductor device including the mold compound is exposed to heat that substantially transitions the layer from a solid phase to a gas phase or a vapor phase. In some examples, the mold compound includes a material having a relatively small temperature region between solid and gas. Thus, using the examples disclosed herein, the mold compound can be sublimed off of the semiconductor device and/or easily removed from structural voids, hidden pockets, etc. of the MEMs devices, the semiconductor devices, the wafer, the circuit, etc., if desired. To enable the gas or vapor to exhaust and/or vent from the package, in some such examples, a vent is defined in a mold compound that covers the structure (e.g., MEMs device). To deter the structure from being exposed to the environment, the vent can be covered via a plug or film before and/or after venting occurs. In examples in which the plug or film covers the vent prior to venting, the plug or film may cover the vent during operations prior to venting and the plug or film may thereafter be released to enable venting to occur. In some examples, the vent is covered using a laminate, an epoxy resin (e.g., B stage epoxy resin) and/or any other material that can be thermally and/or UV cured.

Figure 1A:
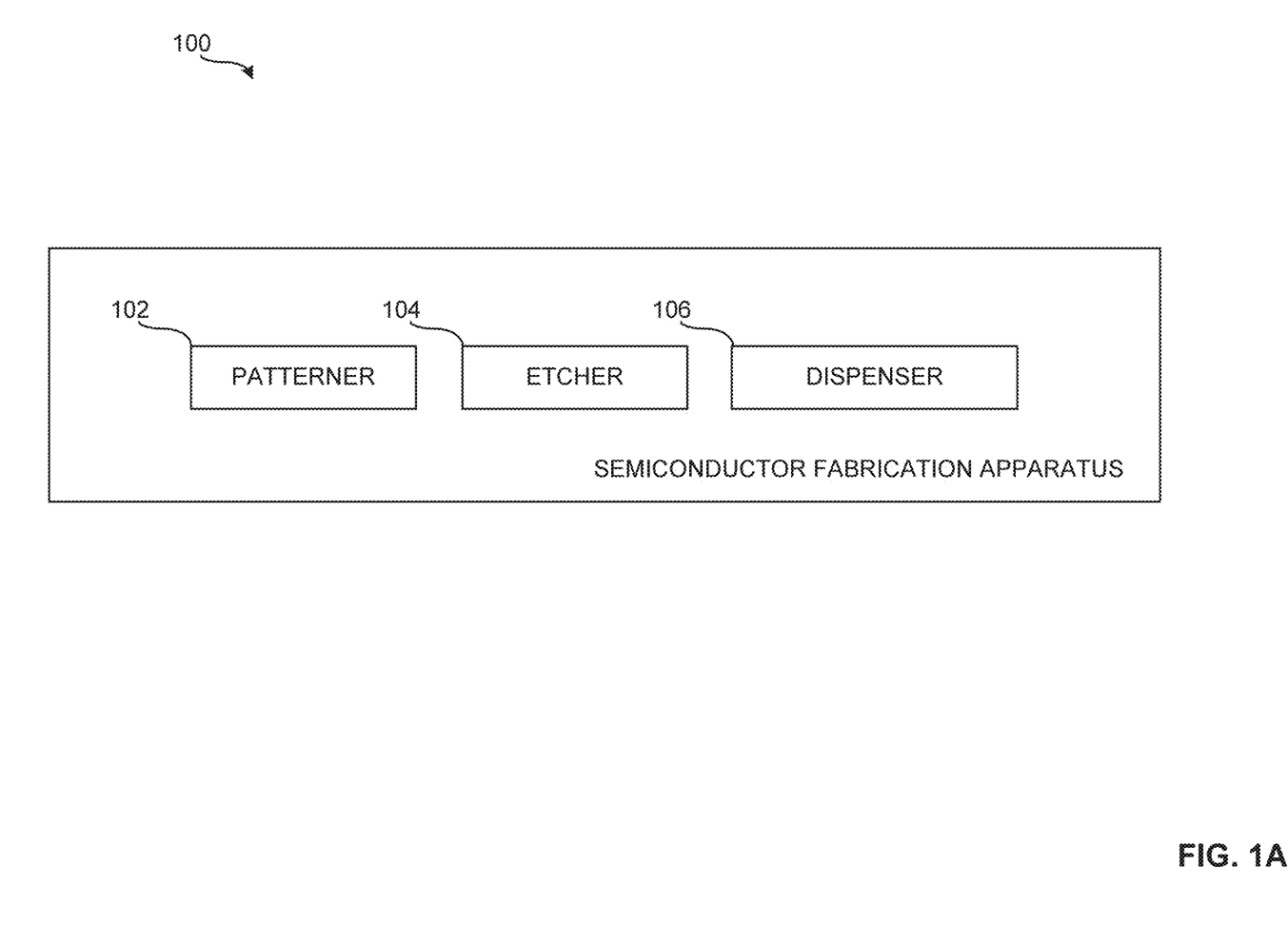
FIG. 1A is a schematic illustration of an example semiconductor fabrication apparatus that can be used to produce example semiconductor devices in accordance with the teachings of this disclosure.
Figure 2:
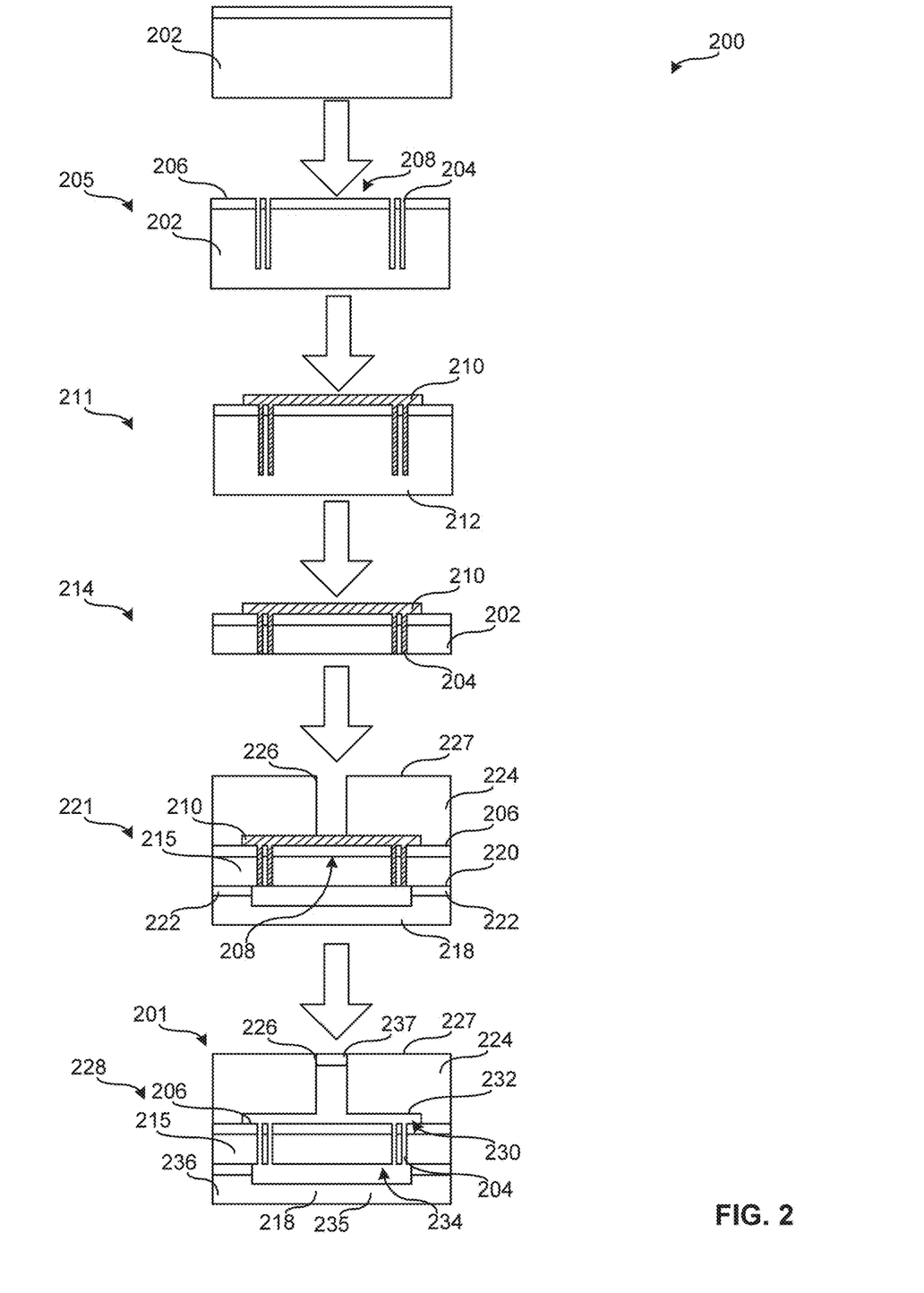
FIG. 2 depicts a series of figures showing a semiconductor device at various processing stages.

FIG. 1A illustrates an example semiconductor fabrication apparatus 100 to produce example semiconductor devices, example integrated circuits, example MEMs devices or any other device in accordance with the teachings of this disclosure. In the illustrated example, the example semiconductor fabrication apparatus 100 includes an example patterner 102, an example etcher 104 and an example dispenser 106. In some examples, one or more of the example patterner 102, the example etcher 104 and/or the example dispenser 106 are implemented by the same apparatus. In some examples, one or more of the example patterner 102, the example etcher 104 and/or the example dispenser 106 are implemented by different apparatus. In some examples, one or more of the example patterner 102, the example etcher 104 and/or the example dispenser 106 are located in one or more facilities (e.g., manufacturing facilities). In some examples, one or more of the example patterner 102, the example etcher 104 and/or the example dispenser 106 are located in the same facility (e.g., manufacturing facilities). FIG. 2 illustrates an example series of FIG. 200 showing an example semiconductor device and/or an example integrated circuit package 201 at various processing stages.

Referring to FIGS. 1A, and 2, in some examples, the semiconductor fabrication apparatus 100 causes the patterner 102 to define a pattern on an example water 202 and causes the etcher 104 to etch example grooves and/or trenches 204 in the wafer 202 as shown at reference number 205 of FIG. 2. In some examples, the trenches 204 are formed on a first side 206 of the wafer 202 to enable an example suspended and/or MEMs region 208 to be later defined. In some examples, the trenches 204 are L-shaped and form a rectangle around the MEMs region 208. In some examples, four trenches 204 are defined having some substantially parallel legs that surround the MEMs region 208. As set forth herein, substantially parallel means between about zero and five degrees of parallel. In some example, input/output paths are defined adjacent the trenches 204 and the MEMs region 208 is associated with a precision core integrated circuit. In some examples, the MEMs region 208 is separated and/or isolated from the remainder of the wafer 202 via the trenches 204.

To protect the MEMs region 208 during subsequent processes, in the illustrated example, the dispenser 106 dispenses protective material and/or a first mold compound 210 onto the wafer 202, into the trenches 204 and overtop of the first side 206 as shown at reference number 211 of FIG. 2. The protective material can be a sublimation material that is solid at room temperature and sublimes at a selected temperature. Thus, the first mold compound 210 may remain in a solid state that encapsulates and/or otherwise protects the MEMs region 208 during one or more processes and is thereafter removed by exposing the integrated circuit package 201 to a threshold temperature and/or a threshold pressure.

In some examples, the trenches 204 enable the MEMs region 208 to be substantially thermally isolated, substantially electrically isolated and/or substantially mechanically isolated from other portions of the integrated circuit package 201. As set forth herein, substantially thermally isolated means that the MEMs region 208 is not structured and/or configured to exchange energy with the environment and/or the integrated circuit package 201. As set forth herein, substantially mechanically isolated means that the MEMs region 208 is not structured and/or configured to perform work on the environment and/or the integrated circuit package 201. In other words, in some examples, the MEMs region 208 is structured not to couple heat, vibration or other energy from the MEMs region 208 to the rest of the integrated circuit package 201 or the environment and/or to not couple heat or other energy from the integrated circuit package 201 or the environment to the MEMs region 208.

In some examples, the dispenser 106 is implemented by an inkjet printer, a 3D printer and/or a screen printer that applies and/or deposits the first mold compound 210 onto the wafer 202. In the example of FIG. 2, to enable the first mold compound 210 to be relatively flat and/or to have relatively sharp edges, the first mold compound 210 is deposited, via the dispenser 106, using a lithography-based approach and/or a laminate based approach. However, in other examples, any other process can be used.

One or more of the elements, processes and/or devices illustrated in FIG. 1A may be combined, divided, re-arranged, omitted, eliminated and/or implemented in any other way. Further, the example patterner 102, the example etcher 104 and the example dispenser 106 and, more generally, the example semiconductor fabrication apparatus 100 may be implemented by hardware, software, firmware and/or any combination of hardware, software and/or firmware. Thus, for example, any of the example patterner 102, the example etcher 104 and the example dispenser 106 and, more generally, the example semiconductor fabrication apparatus 100 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example patterner 102, the example etcher 104 and the example dispenser 106 and, more generally, the example semiconductor fabrication apparatus 100 is/are hereby expressly defined to include a non-transitory computer readable storage device or storage disk such as a memory, a digital versatile disk (DVD), a compact disk (CD), a Blu-ray disk, etc. including the software and/or firmware. Further still, the example semiconductor fabrication apparatus 100 of FIG. 1 may include one or more elements, processes and/or devices in addition to, or instead of, those illustrated in FIG. 1, and/or may include more than one of any or all of the illustrated elements, processes and devices.

Figure 1B:
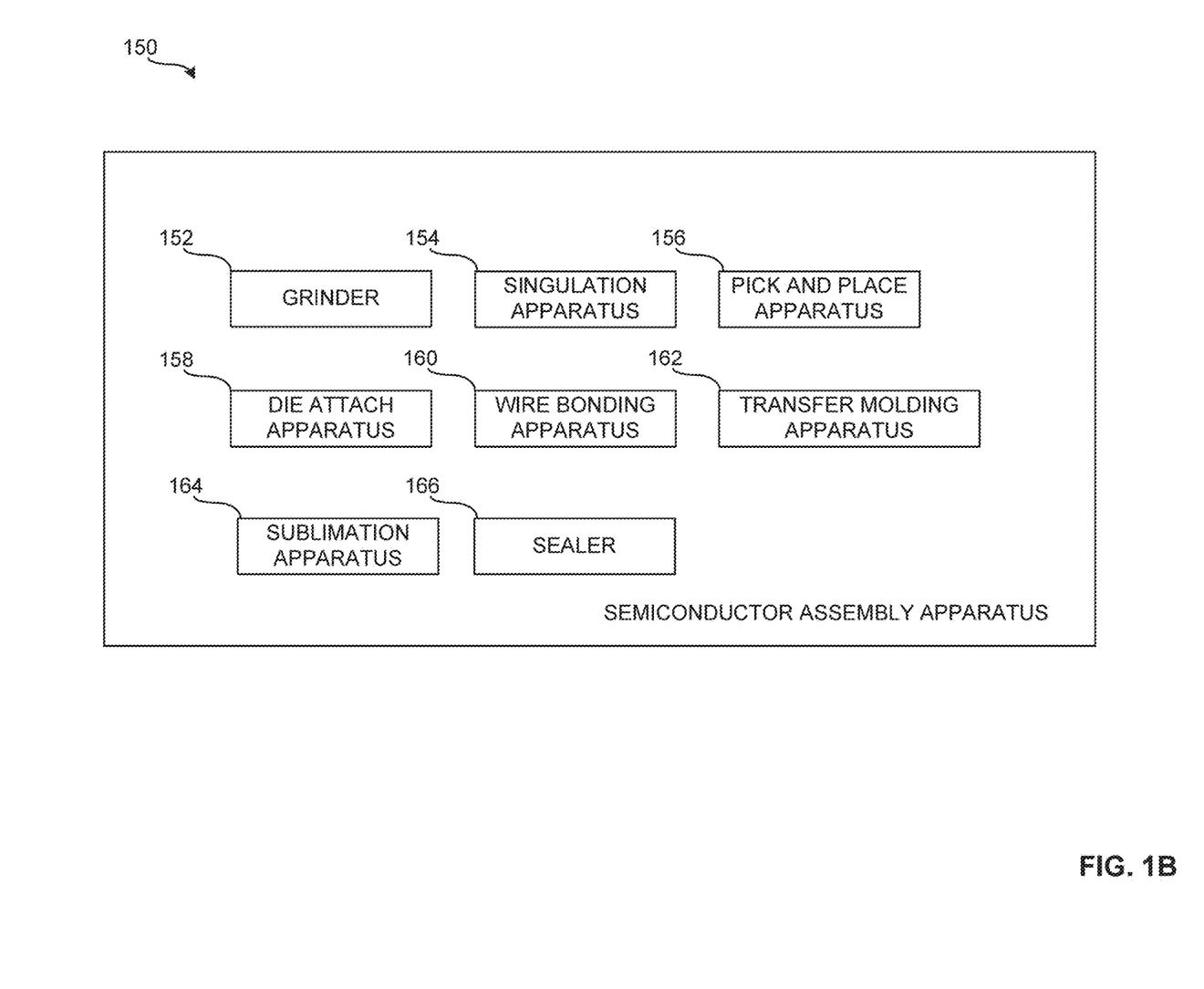
FIG. 1B is a schematic illustration of an example semiconductor assembly apparatus that can be used to produce example semiconductor devices in accordance with the teachings of this disclosure.

FIG. 1B illustrates an example semiconductor assembly apparatus 150 to produce example semiconductor devices, example integrated circuits, example MEMs devices or any other device in accordance with the teachings of this disclosure. In the illustrated example, the example semiconductor assembly apparatus 150 includes an example grinder 152, an example singulation apparatus 154, an example pick-and-place apparatus 156, an example die attach apparatus 158, an example wire bonding apparatus 160, an example transfer molding apparatus 162, an example sublimation apparatus 164 and an example sealer 166. In some examples, one or more of the example grinder 152, the example singulation apparatus 154, the example pick-and-place apparatus 156, the example die attach apparatus 158, the example wire bonding apparatus 160, the example transfer molding apparatus 162, the example sublimation apparatus 164 and/or the example sealer 166 are implemented by the same apparatus. In some examples, one or more of the example grinder 152, the example singulation apparatus 154, the example pick-and-place apparatus 156, the example die attach apparatus 158, the example wire bonding apparatus 160, the example transfer molding apparatus 162, the example sublimation apparatus 164 and/or the example sealer 166 are implemented by different apparatus. In some examples, one or more of the example grinder 152, the example singulation apparatus 154, the example pick-and-place apparatus 156, the example die attach apparatus 158, the example wire bonding apparatus 160, the example transfer molding apparatus 162, the example sublimation apparatus 164 and/or the example sealer 166 are located in one or more facilities (e.g., manufacturing facilities). In some examples, one or more of the example grinder 152, the example singulation apparatus 154, the example pick-and-place apparatus 156, the example die attach apparatus 158, the example wire bonding apparatus 160, the example transfer molding apparatus 162, the example sublimation apparatus 164 and/or the example sealer 166 are located in the same facility (e.g., manufacturing facilities).

Figure 3:
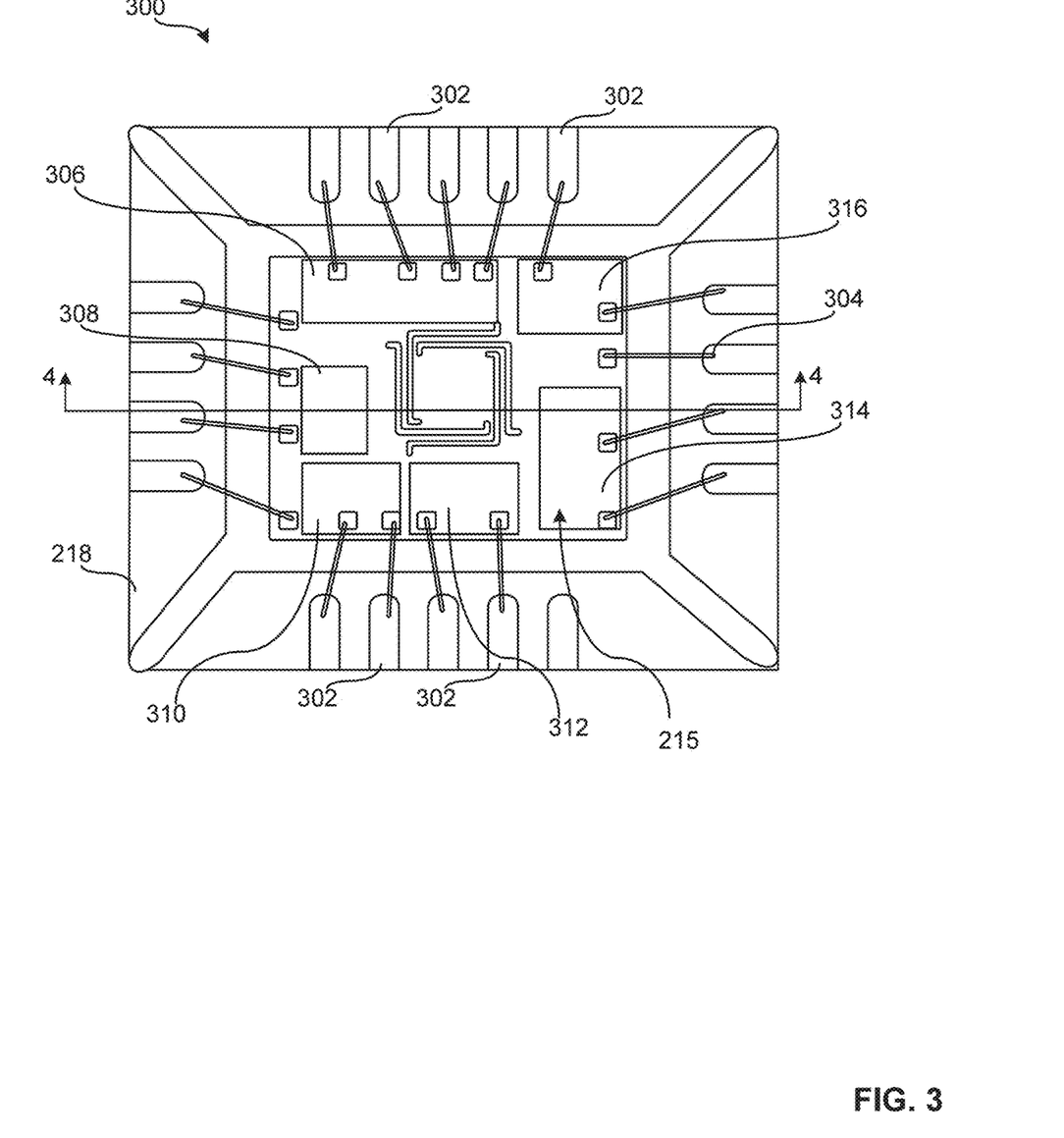
FIG. 3 is a plan view of an example semiconductor device that can be produced by the example semiconductor manufacturing apparatus of FIG. 1.

Referring to FIGS. 1B, 2 and 3, in some examples, to enable the MEMS region 208 to be suspended after the manufacturing process and/or to enable the trenches 204 to be defined as through holes, in some examples, the semiconductor assembly apparatus 150 causes the grinder 152 to remove a bottom portion 212 of the wafer 202 as shown by reference numbers 212 and 214 of FIG. 2. To obtain an example die 215 from the wafer 202, the example singulation apparatus 154 performs one or more processes on the wafer 202 to separate the die 215 from the wafer 202. To enable the example die 215 to be positioned on an example lead frame 218, the example pick-and-place apparatus 156 moves the die 215 and places the die 215 onto the lead frame 218 such that a second surface 220 of the die 215 is immediately adjacent the lead frame 218. In some examples, to couple the die 215 to the lead frame 218, the die attach apparatus 158 applies die attach material 222 onto the die 215 and/or the lead frame 218 prior to the placement of the die 215 onto the lead frame 218. The die attach material 222 may include adhesive or other attachment means. Reference number 221 of FIG. 2, illustrates the lead frame 218 coupled to the second surface 220 of the die 215 via the die attach material 222 and forming the example integrated circuit package 201.

To electrically couple leads 302 (FIG. 3) of the lead frame 218 and the die 215, in some examples, the example wire bonding apparatus 160 couples wires 304 (FIG. 3) between the leads 302 and the die 215. The wires 304 may be soldered connections, welded connections, solder balls, copper posts and/or any other type of electrical connection. As shown at reference number 221 of FIG. 2, a layer and/or a second mold compound 224 is shown that has been applied by the transfer molding apparatus 162 that covers the first surface 206 and the first mold compound 210. In some examples, a package injection molding technique is used to apply the second mold compound 224. The second mold compound 224 can be formed of a compound, a mold material, plastic, glass, ceramic, etc. However, the second mold compound 224 can be made of any other material. In some examples, the second mold compound 224 may horizontally extend further than shown in FIG. 2. In some examples, the lead frame 218 may horizontally extend further than shown in FIG. 2. Further, while the lead frame 218 of FIG. 2 is depicted as a half-etched lead frame, in other examples, the lead frame 218 is implemented with a standard lead frame that enables a gap (e.g. a 1 micron gap) to be present between the lead frame 218 and the MEMs device 208. In some examples, the die attach material 222 is sized to provide a threshold gap between the lead frame 218 and the die 215.

In some examples, to provide access to the first mold compound 210 and/or to enable the first mold compound 210 to be vented from the integrated circuit package 201 after a sublimation event occurs, the second mold compound 224 defines a vent 226. While the vent 226 is shown exiting a first surface 227 of the second mold compound 224 and is substantially perpendicular relative to the MEMs device 208 and/or a plane that extends along a length of the die 215, the vent 226 may be positioned in any other way. For example, the vent 226 may be defined through one or more sides of the second mold compound 224, etc. In some examples, the vent 226 has a diameter of between one micrometer and one millimeter having any cross section (e.g., a circular cross section, a rectangular cross section, etc.). As set forth herein, substantially perpendicular means between about zero and five degrees of perpendicular.

In some examples, the transfer molding apparatus 162 forms the vent 226 by using a mold during a package injection molding process when applying the second mold compound 224 to the first side 206 and the first mold compound 210. In some examples, a film assisted molding process can be used to define the vent 226. In other examples, the vent 226 is formed by laser ablation and/or by otherwise defining the vent 226 through the second mold compound 224 after the second mold compound 224 is applied by the transfer molding apparatus 162. In other examples, the second mold compound 224 is applied and the vent 226 is defined using a 3-D printing process.

To remove the first mold compound 210 and/or to release the MEMs region 208 from being protected by the first mold compound 210, in some examples, the sublimation apparatus 164 implemented as a heater exposes the integrated circuit device 201 to heat that causes the first mold compound 210 to change from a solid state to a gas state and/or a vapor state and to vent through the vent 226. As shown at reference number 228 of FIG. 2, after the gas and/or vapor vents through the vent 226, the first mold compound 210 no longer fills in the trenches 204 and no longer covers the first side 206 of the die 215. Thus, based on the absence of the first mold compound 210 within the integrated circuit package 201, a first gap and/or cavity 230 is defined between the first surface 206 of the die 215 and an opposing surface 232 of the second mold compound 224. Additionally, based on the absence of the first mold compound 210 within the integrated circuit package 201, the first mold compound 210 is no longer present in the trenches 204 between the first gap 230 and a second gap 234, where the second gap 234 is defined between the die 215 and the lead frame 218. In some examples, the second gap 234 is provided based on a thickness of the die attach material 222. In other examples, the second gap 234 is provided based on the lead frame 218 having a first portion 235 having less thickness than a second portion 236 of the lead frame 218. Put another way, the lead frame 218 is a half-etched lead frame that enables the second gap 234 to be defined. To deter the MEMs region 208 from being exposed to the environment, in this example, the sealer 166 couples a seal 237 to the second mold compound 224 and/or otherwise covers the vent 226 as shown at reference number 228 of FIG. 2. In some examples, the vent 226 acts as a port to enable access to the MEMs region 208. In some examples, the vent 226 enables light, gas, fluid and/or other access to the MEMs region 208.

FIG. 3 is a plan view of an example semiconductor device and/or an integrated circuit package 300 produced according to the teachings of this disclosure. As shown in FIG. 3, the semi-conductor device 300 includes first, second, third, fourth, fifth and sixth components 306, 308, 310, 312, 314, 316 that are coupled to the lead frame 218 via the wires 304. In some examples, the wires 304 mechanically connect the die 215 and the lead frame 218. The components 306, 308, 310, 312, 314, 316 provide functionality to the semiconductor device 300 such as, for example, thermal regulation functionality, support functionality, noise filter functionality, outlet buffer functionality, pre-registration functionality and trimming functionality. While the components 306, 308, 310, 312, 314, 316 are illustrated as having a particular size and/or shape and being positioned in a particular arrangement, the semiconductor device 300 may include any number of components (e.g., 1, 2, 4, 7, etc.) having any size and in any arrangement.

Figure 4:
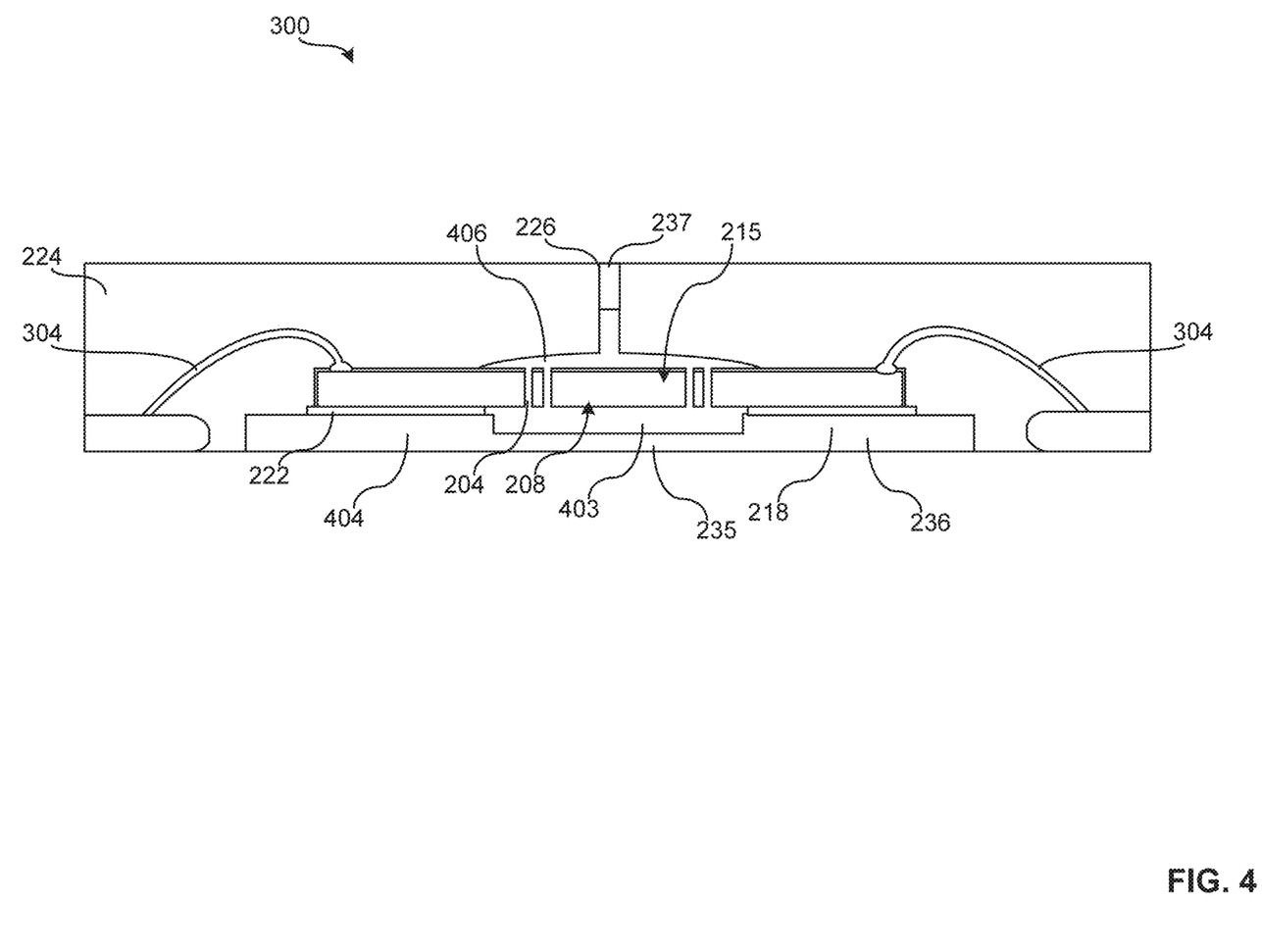
FIG. 4 is a cross-sectional view of the example semiconductor device of FIG. 3.

FIG. 4 is a cross-sectional view of the example semiconductor device 300 of FIG. 3 taken along line 4-4 of FIG. 3. As shown in FIG. 4, the semiconductor device 300 includes the lead frame 218 on which the die 215 is coupled via the die attach material 222 or other means. In some examples, the die attach material 222 is sized to offset the lead frame 218 from the MEMs region 208. In other examples, the lead frame 218 includes the portion 235 having less thickness than the other portion 236 of the lead frame 218 (e.g., a half-etched lead frame).

To protect the die 215 from damage and/or to enable the die 215 to be implemented in another device (e.g., an electronics device or otherwise), the second mold compound 224 covers the die 215. To enable the MEMs region 208 to be suspended and/or spaced from opposing surfaces of the lead frame 218 and the second mold compound 224, an example cavity 403 is defined by an example die attach pad portion 404 of the lead frame 218 and the second mold compound 224. As shown in the illustrated example of FIG. 4, the MEMs region 208 is disposed in the cavity 403 and an example gap 406 is defined between the MEMs region 208 and the second mold compound 224. In some examples, the gap 406 has a semicircular cross-section based on the first mold compound 210 being applied by a printing and/or depositing technique enabling the gap 406 to have a fluid-rounded shape. In this example, the second mold compound 224 includes the vent 226 to enable the first mold compound 210 to exhaust from the semiconductor device 300 after, for example, package molding. However, in examples in which the first mold compound 210 is removed prior to package molding, the second mold compound 224 may not include the vent 226.

Figure 5:
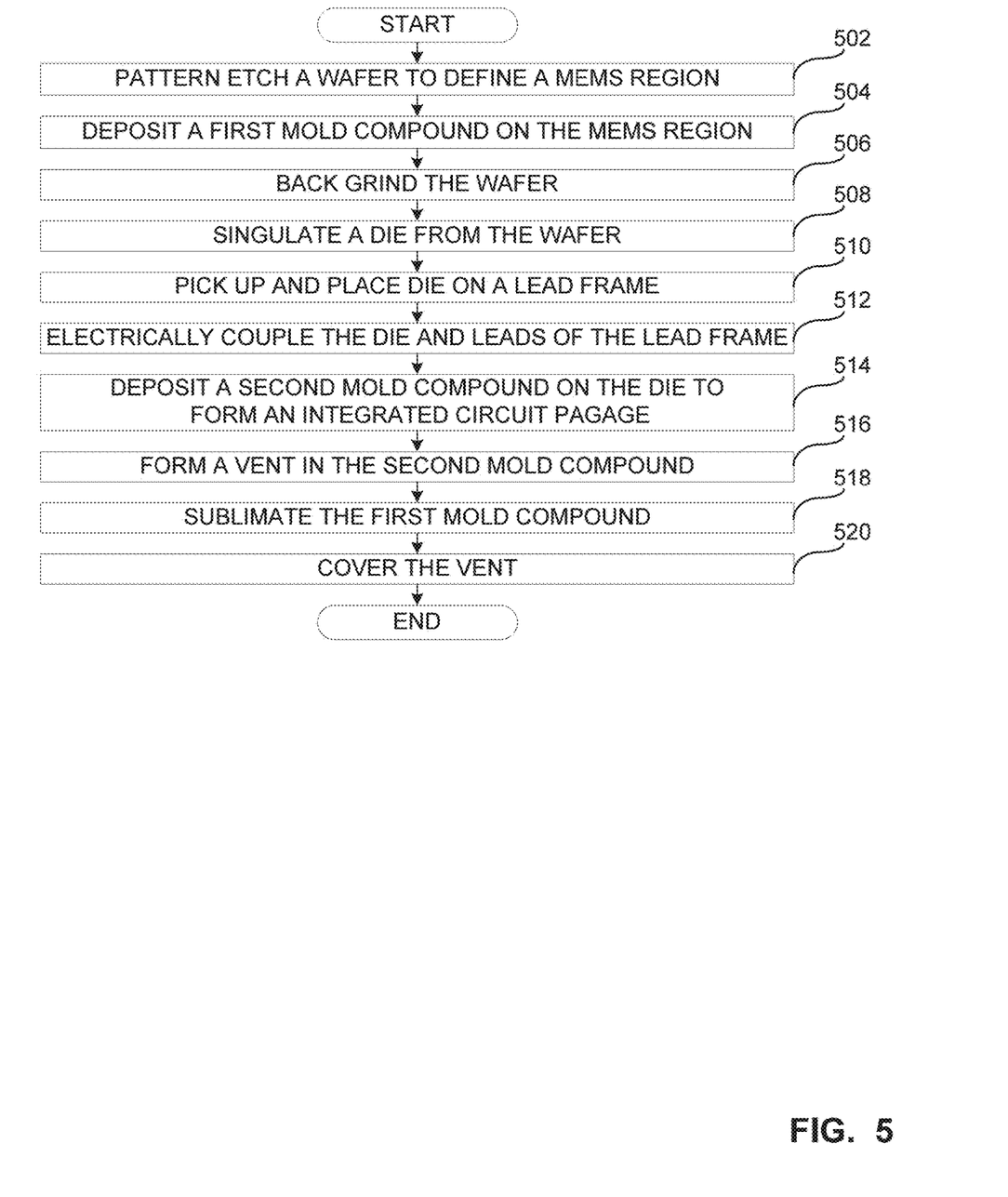
FIG. 5 is a flow diagram representative of machine readable instructions that may be executed to implement processes performed by the example semiconductor fabrication apparatus of FIG. 1A and/or the semiconductor assembly apparatus of FIG. 1B to produce the example semiconductor device of FIGS. 3 and 4.

A flowchart representative of example machine readable instructions for implementing the semiconductor fabrication apparatus 100 of FIG. 1A and/or the semiconductor assembly apparatus 150 of FIG. 1B is shown in FIG. 5. In this example, the machine readable instructions comprise a program for execution by a processor such as the processor 612, 712 shown in the example processor platform 600, 700 discussed below in connection with FIGS. 6, 7. The program may be embodied in software stored on a non-transitory computer readable storage medium such as a CD-ROM, a floppy disk, a hard drive, a digital versatile disk (DVD), a Blu-ray disk, or a memory associated with the processor 612, 712, but the entire program and/or parts thereof could alternatively be executed by a device other than the processor 612, 712 and/or embodied in firmware or dedicated hardware. For example, one or more of the blocks, portions of the blocks or the initiation thereof may be carried out manually. Further, although the example program is described with reference to the flowchart illustrated in FIG. 5, many other methods of implementing the example semiconductor fabrication apparatus 100 and/or the example semiconductor assembly apparatus 150 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIG. 5 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

The program of FIG. 5 begins at block 502 with the patterner 102 and the etcher 104 pattern etching the wafer 202 to define the MEMs region 208. The dispenser 106 deposits the first mold compound 210 on the MEMs region 208 to substantially protect the MEMs region 208 during subsequent processes (block 504). In some examples, the first mold compound 210 include a sublimation material and/or one or more of Neopentyl glycol, Trimethylolethane layer or a 2 5-dimethyl-2 5-hexanediol. In some examples, the first mold compound 210 is deposited using an ink jet printing process, a spin coat lithography process, a screen printing process or a three-dimensional printing process.

The grinder 152 back grinds the wafer 202. (block 506). The singulation apparatus 154 separates the die 215 from the wafer 202, (block 508). The pick and place apparatus 156 picks up and places the die 215 on the lead frame 218, (block 510). In some examples, the lead frame 218 includes the die attach pad 404 and the plurality of leads 302. The wire bonding apparatus 160 electrically couples the die 215 and the plurality of leads 302 via the wires 304 (block 512). The transfer molding apparatus 162 deposits the second mold compound 224 on the die 215 to form the integrated circuit package 201 (block 514). The transfer molding apparatus 162 forms the vent 226 in the second mold compound 224 (block 516). In some examples, the transfer molding apparatus 162 forms the vent 226 using a film assisted molding process. In other examples, the vent 226 is formed by laser ablation and/or by otherwise defining the vent 226 through the second mold compound 224. In other examples, the second mold compound 224 is applied and the vent 226 is defined using a 3-D printing process.

The sublimation apparatus 164 sublimates the first mold compound 210 to define the first gap 230 between a surface of the die 215 and a surface of the second mold compound 224 (block 518). The first mold compound 210 can vent through the vent 226 when the seal 237 is not covering the vent 226. In some examples, sublimating the first mold compound 210 includes substantially thermally isolating the MEMs 208, substantially electrically isolating the MEMs region 208, or substantially mechanically isolating the MEMs region 208. In some examples, sublimating of the first mold compound 210 includes heating the integrated circuit package 201. The sealer 166 covers the vent 226 with the seal 237 (block 520).

Figure 6:
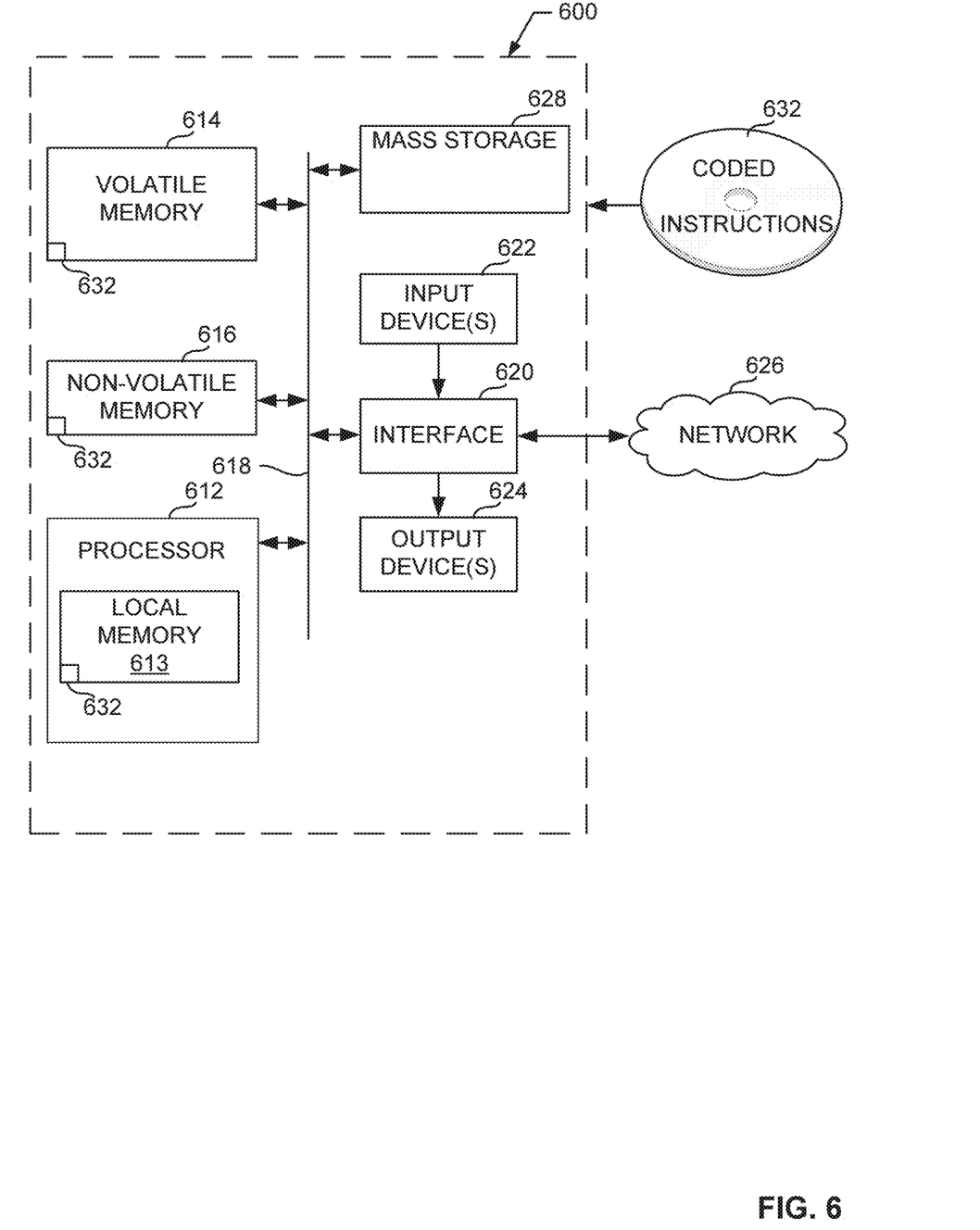
FIG. 6 is a processor platform to execute the instructions of FIG. 5 to implement the example semiconductor fabrication apparatus of FIG. 1A.

FIG. 6 is a block diagram of an example processor platform 600 capable of executing the instructions of FIG. 5 to implement the semiconductor fabrication apparatus 100 of FIG. 1A. The processor platform 600 can be, for example, a server, a personal computer, a mobile device (e.g., a cell phone, a smart phone, a tablet such as an iPad™), a personal digital assistant (PDA), an Internet appliance, or any other type of computing device.

The processor platform 600 of the illustrated example includes a processor 612. The processor 612 of the illustrated example is hardware. For example, the processor 612 can be implemented by one or more integrated circuits, logic circuits, microprocessors or controllers from any desired family or manufacturer. The hardware processor may be a semiconductor based (e.g., silicon based) device.

The processor 612 of the illustrated example includes a local memory 613 (e.g., a cache). The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 616 may be implemented by flash memory and/or any other desired type of memory device. Access to the main memory 614, 616 is controlled by a memory controller.

The processor platform 600 of the illustrated example also includes an interface circuit 620. The interface circuit 620 may be implemented by any type of interface standard, such as an Ethernet interface, a universal serial bus (USB), and/or a PCI express interface.

In the illustrated example, one or more input devices 622 are connected to the interface circuit 620. The input device(s) 622 permit(s) a user to enter data and/or commands into the processor 612. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 624 are also connected to the interface circuit 620 of the illustrated example. The output devices 624 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 620 of the illustrated example, thus, typically includes a graphics driver card, a graphics driver chip and/or a graphics driver processor.

The interface circuit 620 of the illustrated example also includes a communication device such as a transmitter, a receiver, a transceiver, a modem and/or network interface card to facilitate exchange of data with external machines (e.g., computing devices of any kind) via a network 626 (e.g., an Ethernet connection, a digital subscriber line (DSL), a telephone line, coaxial cable, a cellular telephone system, etc.).

The processor platform 600 of the illustrated example also includes one or more mass storage devices 628 for storing software and/or data. Examples of such mass storage devices 628 include floppy disk drives, hard drive disks, compact disk drives, Blu-ray disk drives, RAID systems, and digital versatile disk (DVD) drives.

The coded instructions 632 of FIG. 5 may be stored in the mass storage device 628, in the volatile memory 614, in the non-volatile memory 616, and/or on a removable tangible computer readable storage medium such as a CD or DVD.

Figure 7:
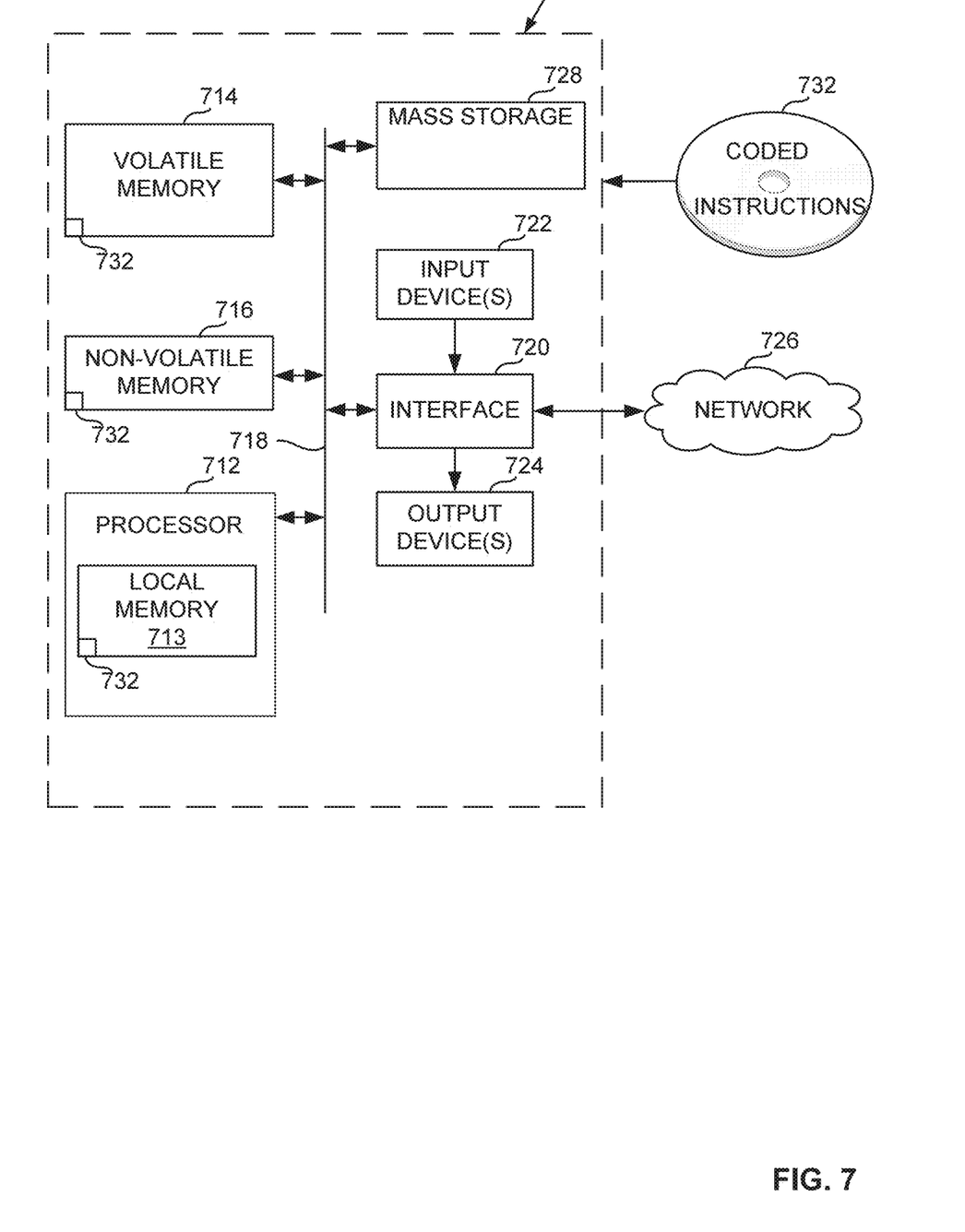
FIG. 7 is a processor platform to execute the instructions of FIG. 5 to implement the example semiconductor assembly apparatus of FIG. 1B.

FIG. 7 is a block diagram of an example processor platform 700 capable of executing the instructions of FIG. 5 to implement the semiconductor assembly apparatus 150 of FIG. 1B. The processor platform 700 can be, for example, a server, a personal computer, a mobile device (e.g., a cell phone, a smart phone, a tablet such as an iPad™), a personal digital assistant (PDA), an Internet appliance, or any other type of computing device.

The processor platform 700 of the illustrated example includes a processor 712. The processor 712 of the illustrated example is hardware. For example, the processor 712 can be implemented by one or more integrated circuits, logic circuits, microprocessors or controllers from any desired family or manufacturer. The hardware processor may be a semiconductor based (e.g., silicon based) device.

The processor 712 of the illustrated example includes a local memory 713 (e.g., a cache). The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 716 may be implemented by flash memory and/or any other desired type of memory device. Access to the main memory 614, 616 is controlled by a memory controller.

The processor platform 700 of the illustrated example also includes an interface circuit 720. The interface circuit 720 may be implemented by any type of interface standard, such as an Ethernet interface, a universal serial bus (USB), and/or a PCI express interface.

In the illustrated example, one or more input devices 722 are connected to the interface circuit 720. The input device (s) 722 permit(s) a user to enter data and/or commands into the processor 712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 720 of the illustrated example, thus, typically includes a graphics driver card, a graphics driver chip and/or a graphics driver processor.

The interface circuit 720 of the illustrated example also includes a communication device such as a transmitter, a receiver, a transceiver, a modem and/or network interface card to facilitate exchange of data with external machines (e.g., computing devices of any kind) via a network 726 (e.g., an Ethernet connection, a digital subscriber line (DSL), a telephone line, coaxial cable, a cellular telephone system, etc.).

The processor platform 700 of the illustrated example also includes one or more mass storage devices 728 for storing software and/or data. Examples of such mass storage devices 728 include floppy disk drives, hard drive disks, compact disk drives, Blu-ray disk drives, RAID systems, and digital versatile disk (DVD) drives.

The coded instructions 732 of FIG. 5 may be stored in the mass storage device 728, in the volatile memory 714, in the non-volatile memory 716, and/or on a removable tangible computer readable storage medium such as a CD or DVD.

From the foregoing, it will be appreciated that example methods, apparatus and articles of manufacture have been disclosed that relate to example micro-electro-mechanical-systems (MEMs) that can be used in diverse applications and methods and apparatus of producing such MEMs. In some examples, the example MEMs disclosed herein are 3D silicon mechanical structures that may be free standing and/or partially restricted (e.g., thermally isolated, mechanically isolated). To deter these free standing and/or partially restricted structures of the MEMs from being damaged, in some examples, these MEMs structures are held in place and/or protected by a sacrificial layer.

In some examples, the example sacrificial layer is structured to release and/or expose the associated MEMs structure when an event occurs. For example, after some and/or all semiconductor manufacturing processes have taken place and/or when the likelihood of damaging the MEMs structure is reduced, the semiconductor assembly may be exposed to heat and/or pressure (e.g., the event) to cause the sacrificial layer to sublime and/or to otherwise no longer cover and/or encapsulate the MEMs structure. In some examples, after sublimation, the vapor and/or gas associated with the sacrificial layer is exhausted from the semiconductor assembly through a vent. To deter the MEMs structure from being exposed to particulate contamination, electrostatic charging damage, moisture, etc., the vent may be covered using a film (e.g., a protective film) and/or a plug. In some examples, the vent is covered using an epoxy and/or a laminate.

Example 1

An example integrated circuit package, includes a lead frame including a die attach pad and a plurality of leads; a die including a MEMs region defined by a plurality of trenches, the die electrically connected to the plurality of leads; and a mold compound covering portions of the die, the mold compound defining a cavity between a surface of the die and a surface of the mold compound, the mold compound defines a vent.

Example 2

In Example 1 or other examples, the vent is substantially perpendicular to a plane along a length of the die and has a diameter of between about one micrometer and one millimeter.

Example 3

In Examples 1, 2 or other examples, the vent is in communication with the cavity.

Example 4

In Examples 1, 2, 3 or other examples, the die attach pad includes a portion that is half etched.

Example 5

In Examples 1, 2, 3, 4 or other examples, a thickness of the portion is less than a thickness of a second portion of the die attach pad.

Example 6

In Examples 1, 2, 3, 4, 5 or other examples, further including a plug covering the vent.

Example 7

In Examples 1, 2, 3, 4, 5, 6 or other examples, the trenches surround the MEMs region.

Example 8

In Examples 1, 2, 3, 4, 5, 6, 7 or other examples, the trenches include four trenches that define a rectangle around the MEMs region.

Example 9

In Examples 1, 2, 3, 4, 5, 6, 7, 8 or other examples, the trenches are substantially L-shaped.

Example 10

An example method, includes pattern etching a wafer to define a MEMs region; depositing a first mold compound on the MEMs region to substantially protect the MEMs region during subsequent processes, the first mold compound comprising a sublimation material; back grinding the wafer; singulating a die from the wafer; picking up and placing the die on a lead frame including a die attach pad and a plurality of leads; electrically coupling the die and the plurality of leads; depositing a second mold compound on the die to form an integrated circuit package; forming a vent in the second mold compound; and sublimating the first mold compound to define a cavity between a surface of the die and a surface of the second mold compound, the first mold compound to vent through the vent.

Example 11

In Example 10 or other examples, further including covering the vent.

Example 12

In Example 11 or other examples, the depositing of the first mold compound includes depositing the first mold compound using an ink jet printing process, a spin coat lithography process, a screen printing process, or a three-dimensional printing process.

Example 13

In Examples 10, 11, 12 or other examples, the sublimating of the first mold compound includes substantially thermally isolating the MEMs region, substantially electrically isolating the MEMs region, or substantially mechanically isolating the MEMs region.

Example 14

In Examples 10, 11, 12, 13 or other examples, the sublimating of the first mold compound includes heating the integrated circuit package.

Example 15

In Examples 10, 11, 12, 13, 14 or other examples, the first mold compound includes one or more of Neopentyl glycol, Trimethylolethane layer, or a 2 5-dimethyl-2 5-hexanediol.

Example 16

An example method includes dispensing a mold compound on a structure defined by a substrate during a semiconductor manufacturing process, the mold compound to deter the structure from being damaged during the semiconductor manufacturing process; packaging the substrate into an integrated circuit package; and heating the integrated circuit package to sublime the mold compound to remove the mold compound from the substrate.

Example 17

In Example 16 or other examples, the packaging of the die includes applying a second mold compound onto the die.

Example 18

In Example 17 or other examples, the mold compound separates the structure from the second mold compound prior to the mold compound being removed from the structure.

Example 19

In Examples 17, 18 or other examples, the applying of the second mold compound onto the substrate includes forming a vent to enable the mold compound to vent from the integrated circuit package after the heating of the integrated circuit package.

Example 20

In Example 19 or other examples, further including sealing the vent after the mold compound vents from the integrated circuit package.

Example 21

An example apparatus includes a material dispenser to dispense a protective material on a structure defined by a substrate during a manufacturing process; a packager to package the structure including the protective material into a device; and a heater to heat the device to sublime the protective material to remove the protective material from the structure.

Example 22

In Example 21 or other examples, the packager is to package the substrate by applying a layer onto the substrate, the protective material separates the structure from the layer when the packager packages the substrate.

Example 23

In Example 22 or other examples, the layer defines a vent to enable the protective material to vent from the device after the heater heats the device.

Example 24

In Example 23 or other examples, further including a sealer to seal the vent after the protective material vents from the device.

Example 25

In Example 23, 24 or other examples, the structure is positioned within a cavity of the device and the vent is coupled to the cavity.

Example 26

In Examples 21, 22, 23, 24, 25 or other examples, the protective material includes one or more of Neopentyl glycol, Trimethylolethane layer, or a 2 5-dimethyl-2 5-hexanediol.

Example 27

In Examples 21, 22, 23, 24, 25, 26 or other examples, the structure includes a microelectromechanical system.

Example 28

In Examples 21, 22, 23, 24, 25, 26, 27 or other examples, further including an etcher to etch a groove in the substrate to define the structure, the groove to enable the structure to be one or more of substantially thermally isolated or substantially mechanically isolated.

Example 29

An example semiconductor device includes a lead frame; a layer including a vent; and a substrate including a structure disposed within a cavity defined by the lead frame and the layer, the vent coupled to the cavity to enable a protective material to vent from the cavity when a seal is not covering the vent.

Example 30

In Example 29 or other examples, further including the seal covering the vent.

Example 31

An example method, includes dispensing a protective material on a structure defined by a substrate during a semiconductor manufacturing process, the protective material to deter the structure from being damaged during the semiconductor manufacturing process; packaging the substrate into a semiconductor device; and heating the semiconductor device to sublime the protective material to remove the protective material from the structure.

Example 32

In Example 31 or other examples, the packaging of the substrate includes applying a layer onto the substrate.

Example 33

In Example 32 or other examples, the protective material separates the structure from the layer prior to the protective material being removed from the structure.

Example 34

In Examples 32, 33 or other examples, the applying of the layer includes performing a package molding process.

Example 35

In Examples 32, 33, 34 or other examples, the substrate includes forming a vent to enable the protective material to vent from the semiconductor device after the heating of the semiconductor device.

Example 36

In Example 35 or other examples, further including sealing the vent after the protective material vents from the semiconductor device.

Example 37

In Examples 31, 32, 33, 34, 35, 36 or other examples, the structure is positioned within a cavity of the semiconductor device, and the removing of the protective material from the structure includes suspending or disposing the structure within the cavity.

Example 38

In Examples 31, 32, 33, 34, 35, 36, 37 or other examples, the protective material includes one or more of, Neopentyl glycol, Trimethylolethane layer, or a 2 5-dimethyl-2 5-hexanediol.

Example 39

In Examples 31, 32, 33, 34, 35, 36, 37, 38 or other examples, the structure includes a microelectromechanical system.

Example 40

In Examples, 31, 32, 33, 34, 35, 36, 37, 38, 39 or other examples, further including coupling the substrate to a lead frame, wherein the removing of the protective material from the structure includes one or more of substantially thermally isolating the structure, substantially electrically isolating the structure, or substantially mechanically isolating the structure.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated circuit package, comprising:
   a die attach pad and a plurality of leads;
   a die including a MEMs region defined by a plurality of trenches, the die electrically connected to the plurality of leads, the die directly attached to the die attach pad via a die attach material, the die including a first surface facing towards the die attach pad and a second surface facing away from the die attach pad; and
   a mold compound having a third surface covering portions of the second surface of the die, the mold compound having a fourth surface adjacent the third surface, the mold compound defining a cavity between the second surface of the die and the third surface of the mold compound, the fourth surface being spaced farther away from the die attach pad than the third surface, wherein the mold compound includes a vent.

2. The integrated circuit package of claim 1, wherein the vent is substantially perpendicular to a plane along a length of the die and has a diameter of between about one micrometer and one millimeter.

3. The integrated circuit package of claim 1, wherein the vent is in communication with the cavity.

4. The integrated circuit package of claim 1, wherein the die attach pad includes a portion that is half etched.

5. The integrated circuit package of claim 4, wherein a thickness of the portion is less than a thickness of a second portion of the die attach pad.

6. The integrated circuit package of claim 1, further including a plug covering the vent.

7. The integrated circuit package of claim 1, wherein the plurality of trenches surround the MEMs region.

8. The integrated circuit package of claim 1, wherein the plurality of trenches include four trenches that define a rectangle around the MEMs region.

9. The integrated circuit package of claim 8, wherein the plurality of trenches are substantially L-shaped.

10. The integrated circuit package of claim 1, wherein the cavity is a first cavity, the die attach pad defining a second cavity between the first surface of the die and a recessed surface of the die attach pad.

11. The integrated circuit package of claim 1, wherein the plurality of trenches includes a first trench and a second trench, the first trench including a first segment and a second segment, the first trench being substantially L-shaped with the first segment extending transverse to the second segment, the second trench including a third segment and a fourth segment, the second trench being substantially L-shaped with the third segment extending transverse to the fourth segment, the second segment of the first trench spaced apart from and extending alongside the third segment of the second trench.

12. An integrated circuit package, comprising:
a die attach pad and a plurality of leads, the die attach pad including a first cavity;
a die including a MEMS region defined by a plurality of trenches, the die electrically connected to the plurality of leads and directly attached to the die attach pad via a die attach material; and
a mold compound covering portions of a surface of the die, the mold compound including a recess defining a second cavity between the surface of the die and the mold compound, the mold compound further including a vent in communication with the second cavity.

13. The integrated circuit package of claim 12, further including a plug covering the vent.

14. The integrated circuit package of claim 12, wherein the plurality of trenches surround the MEMS region.

15. The integrated circuit package of claim 12, wherein the second cavity includes at least one curved surface in a cross-sectional view of the integrated circuit package.

16. The integrated circuit package of claim 12, wherein the die attach pad includes a support surface and a recessed surface, the recessed surface defining the first cavity, the die being spaced apart from the recessed surface and connected to the support surface on opposite sides of the first cavity.

17. The integrated circuit package of claim 10, wherein the second cavity has a first width and the die attach pad has a second width, the first width being less than the second width.

18. The integrated circuit package of claim 10, wherein the first and second cavities are aligned on opposite sides of the die.

\* \* \* \* \*